(12) United States Patent
Dimaano, Jr. et al.

(10) Patent No.: US 7,141,886 B2
(45) Date of Patent: Nov. 28, 2006

(54) AIR POCKET RESISTANT SEMICONDUCTOR PACKAGE

(75) Inventors: Antonio B. Dimaano, Jr., Singapore (SG); Byung Tai Do, Singapore (SG); Dennis Guillermo, Singapore (SG); Sheila Rima C. Magno, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 11/215,090

(22) Filed: Aug. 29, 2005

(65) Prior Publication Data

US 2006/0043564 A1 Mar. 2, 2006

Related U.S. Application Data

(62) Division of application No. 10/934,129, filed on Sep. 2, 2004, now Pat. No. 6,969,640.

(51) Int. Cl.
*H01L 23/28* (2006.01)

(52) U.S. Cl. .................... 257/796; 257/706; 257/720
(58) Field of Classification Search ................ 257/706, 257/709, 711, 718, 720, 787, 796
See application file for complete search history.

(56) References Cited

U.S. PATENT DOCUMENTS 6,654,248 B1 * 11/2003 Fishley et al. .............. 361/704
6,720,649 B1 * 4/2004 Huang ........................ 257/706

* cited by examiner

*Primary Examiner*—Thanhha S. Pham
(74) *Attorney, Agent, or Firm*—Mikio Ishimaru

(57) ABSTRACT

A die is attached to a substrate and is enclosed in a heat spreader, the heat spreader having a first encapsulant guide and a heat spreader air vent in the heat spreader extending therethrough. An encapsulant encapsulates the die, the substrate, at least a portion of the heat spreader, the first encapsulant guide, and the heat spreader air vent such that the encapsulant enters the heat spreader through the first encapsulant guide and air exits the heat spreader through the heat spreader air vent, thus preventing the formation of air pockets under the heat spreader.

5 Claims, 7 Drawing Sheets

AIR POCKET RESISTANT SEMICONDUCTOR PACKAGE

CROSS-REFERENCE TO RELATED APPLICATION(S)

This is a divisional of application Ser. No. 10/934,129 filed Sep. 2, 2004, now U.S. Pat. No. 6,969,640 which is hereby incorporated by reference thereto.

TECHNICAL FIELD

The present invention relates generally to integrated circuits, and more particularly to package structures for integrated circuits.

BACKGROUND ART

In the electronics industry, a continuing objective is to further and further reduce the size of electronic devices while simultaneously increasing performance and speed. Cellular telephones, personal data devices, notebook computers, camcorders, and digital cameras are but a few of the consumer products that require and benefit from this ongoing miniaturization of sophisticated electronics.

Integrated circuit ("IC") assemblies for such complex electronic systems typically have a large number of interconnected IC chips. The IC chips, commonly called dies, are usually made from a semiconductor material such as silicon or gallium arsenide. Photolithographic techniques are used to form the various semiconductor devices in multiple layers on the dies.

Dies are encapsulated in a molded plastic package that has connectors or leads on the exterior of the package that function as input/output terminals for the die inside the package. The package includes a substrate, a die mounted on the top surface of the substrate, and a heat spreader mounted on the substrate and covering the die.

The substrate may be comprised of a flexible resin tape, a rigid fiber-glass/copper sheet laminate, a co-fired ceramic coupon, a flexible metal lead frame, a ball grid array substrate or other well-known types of substrates in the semiconductor industry, depending on the particular type of semiconductor package being used.

The die is conventionally mounted to the top surface of the substrate with, for example, a layer of an adhesive or an adhesive film, and then electrically connected to the substrate by a number of fine, conductive wires, typically gold (Au) or aluminum (Al), that electrically connect the die to the substrate. The wires are attached to the die at the bonding pads of the die, which are located around the periphery of the die.

The heat spreader is made of a thermally conductive material, usually metal, to improve heat transfer. The heat spreader, covering the die and conductive wires, is attached to the substrate with an adhesive, a thermal paste, or grease. To prevent electrical interference and short circuits, the heat spreader does not touch the die or the conductive wires. Thus, a heat spreader cavity is formed under the heat spreader.

After the heat spreader is attached, the die, the substrate, the heat spreader, and the conductive wires are encapsulated in a mold compound, such as plastic or epoxy, or in a multi-part housing made of plastic, ceramic, or metal. The encapsulation protects the substrate, the heat spreader, the fine conductive wires, and the die from physical, electrical, moisture, and/or chemical damage.

The encapsulation process begins by placing a mold over the die, the substrate, the heat spreader, and the conductive wires. Next, a mold compound is injected into the mold. The mold compound flows through the mold, encasing the die, the substrate, the heat spreader, and the conductive wires.

In order for the heat spreader to efficiently transfer heat, and for the mold compound to protect the die, the substrate, the heat spreader, and the conductive wires, the mold compound must fill the mold and the cavity under the heat spreader. Thus, air must be removed from the mold and from under the heat sink. However, efficient, simple, and cost effective air removal under the heat sink continues to remain a problem during the encapsulation process. In view of the ever-increasing need to save costs and improve efficiencies, it is more and more critical that answers be found to such problems.

Solutions to these problems have been long sought but prior developments have not taught or suggested any solutions and, thus, solutions to these problems have long eluded those skilled in the art.

DISCLOSURE OF THE INVENTION

The present invention provides an air pocket resistant semiconductor package. A die is attached to a substrate and is enclosed in a heat spreader, the heat spreader having a first encapsulant guide and an heat spreader air vent in the heat spreader extending therethrough. An encapsulant encapsulates the die, the substrate, at least a portion of the heat spreader, the first encapsulant guide, and the heat spreader air vent such that the encapsulant enters the heat spreader through the first encapsulant guide and air exits the heat spreader through the heat spreader air vent, thus preventing the formation of air pockets under the heat spreader.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
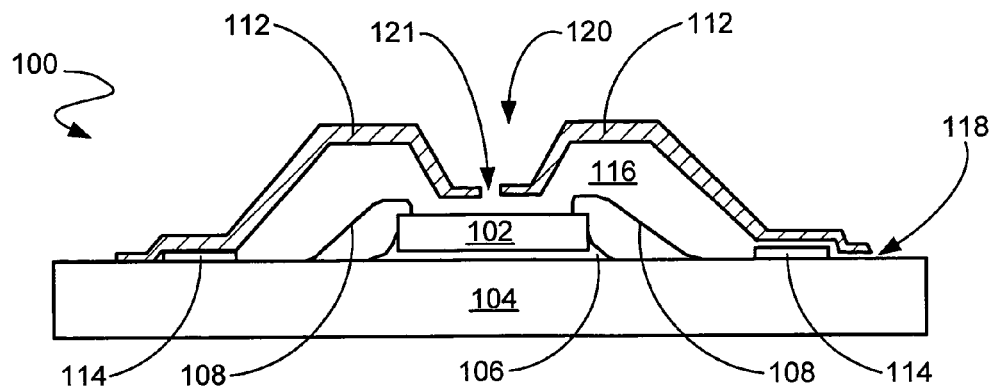
FIG. 1 is a cross-sectional view, taken along line 1—1 in FIG. 4, of an air pocket resistant semiconductor package in an intermediate stage of manufacture, in accordance with an embodiment of the present invention.

In the following description, numerous specific details are given to provide a thorough understanding of the invention. However, it will be apparent that the invention may be practiced without these specific details. In order to avoid obscuring the present invention, some well-known package configuration structural components and process steps are not disclosed in detail.

The drawings showing embodiments of the invention are semi-diagrammatic and not to scale and, particularly, some of the dimensions are for the clarity of presentation and are shown exaggerated in the FIGs. Also, where multiple embodiments are disclosed and described having some features in common, for clarity and ease of illustration, description, and comprehension thereof, like features one to another will ordinarily be described with like reference numerals.

The term "horizontal" as used herein is defined as a plane parallel to the conventional plane or surface of a die, die paddle (or "pad"), or die package, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material, patterning, exposure, development, etching, cleaning, and/or removal of the material as required in forming a described structure.

The term "air" is used herein to describe a generic gas and could include atmospheric air or inert gasses such as argon.

Figure 4:
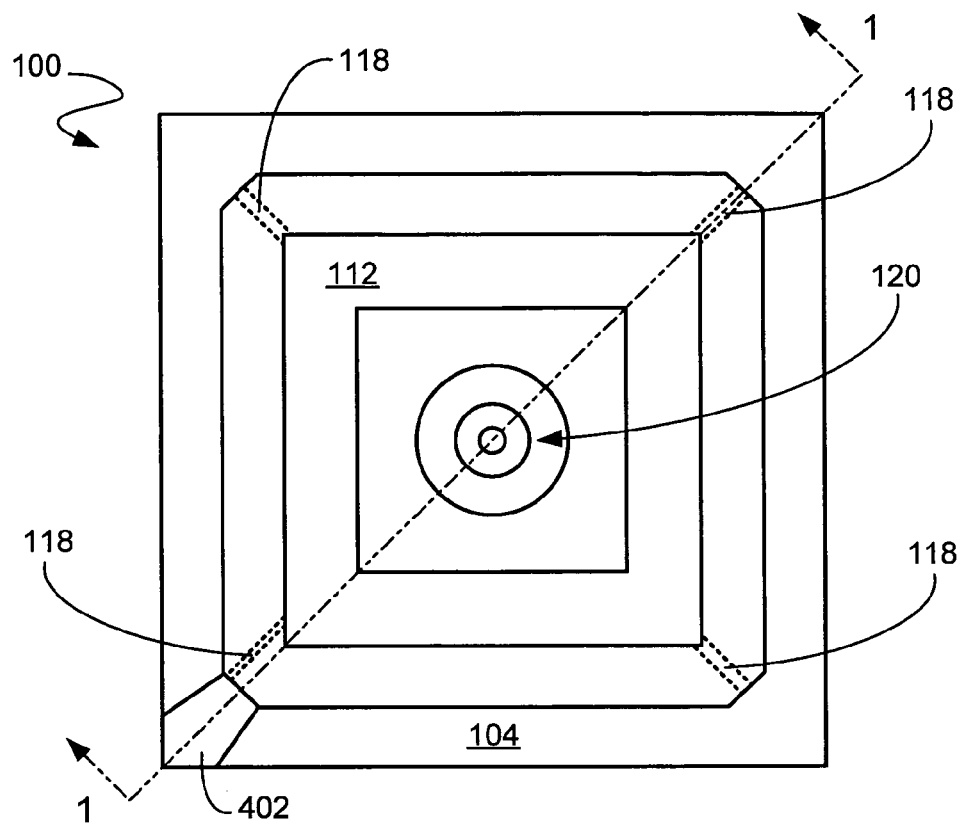
FIG. 4 is a top view of the air pocket resistant semiconductor package of FIG. 1 in an intermediate stage of manufacture.

Referring now to FIGS. 1 and 4, therein is shown a cross-sectional view, taken along line 1—1 in FIG. 4, of an air pocket resistant semiconductor package 100 in an intermediate stage of manufacture, in accordance with an embodiment of the present invention. A die 102 is attached to a substrate 104 with an epoxy 106. The substrate 104 may be comprised of a flexible resin tape, a rigid fiber-glass/copper sheet laminate, a co-fired ceramic coupon, a flexible metal lead frame, a ball grid array substrate or other well-known types of substrates in the semiconductor industry, depending on the particular type of semiconductor package being used.

The die 102 is then electrically connected to the substrate 104 by a number of fine, conductive wires 108, typically gold or aluminum. The wires 108 are wire bonded to the die 102 around the periphery of the die 102, typically with automated wire bonding equipment employing well-known thermal-compression or ultrasonic wire bonding techniques.

A heat spreader 112, optionally having corners, is then attached to the substrate 104 with an adhesive 114. The heat spreader 112 is made of a thermally conductive material, usually metal, to improve heat transfer. To prevent electrical interference and short circuits, the heat spreader 112 encloses and covers, but is free of contact with, the die 102, the epoxy 106, and the conductive wires 108. Thus, the heat spreader 112 is formed to have a heat spreader cavity 116.

An encapsulant guide 120 is formed to be a depression in the top of the heat spreader 112. The encapsulant guide 120 is in the shape of a funnel with sloped sides. At the bottom of the funnel is an opening 121 through the heat spreader 112. A heat spreader air vent 118 is a groove through the base of the heat spreader 112. Thus, the only breaches in the heat spreader 112 are the opening 121 and the heat spreader air vent 118.

Figure 2:
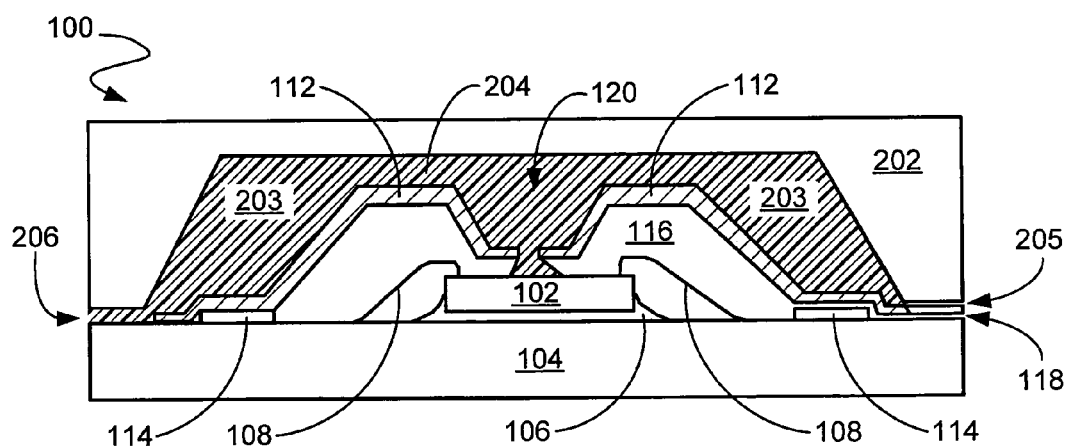
FIG. 2 illustrates the structure of FIG. 1 undergoing encapsulation.

Referring now to FIG. 2, therein is shown the structure of FIG. 1 after further processing. A mold 202 covers the substrate 104 and encloses the die 102, the epoxy 106, the conductive wires 108, the heat spreader 112, the adhesive 114, the heat spreader cavity 116, the heat spreader air vent 118, and the encapsulant guide 120. The mold 202 creates a mold cavity 203 between the mold 202 and the surface of the heat spreader 112. The mold 202 has a mold air vent 205 located at the base of the mold 202 above the heat spreader air vent 118.

It has been discovered that the heat spreader air vent 118 and the encapsulant guide 120 reduce the amount of air trapped in the heat spreader cavity 116 during encapsulation. An encapsulant 204 is injected through an injection port 206. The encapsulant 204 flows over the outside of the heat spreader 112, fills the mold cavity 203, and forces air from the mold cavity 203 out through the mold air vent 205. After completely filling the mold cavity 203, the encapsulant 204 flows through the encapsulant guide 120 at the center of the heat spreader 112, filling the heat spreader cavity 116. As the encapsulant 204 fills the heat spreader cavity 116, air is forced from the heat spreader cavity 116, through the heat spreader air vent 118, and out through the mold 202.

Figure 3:
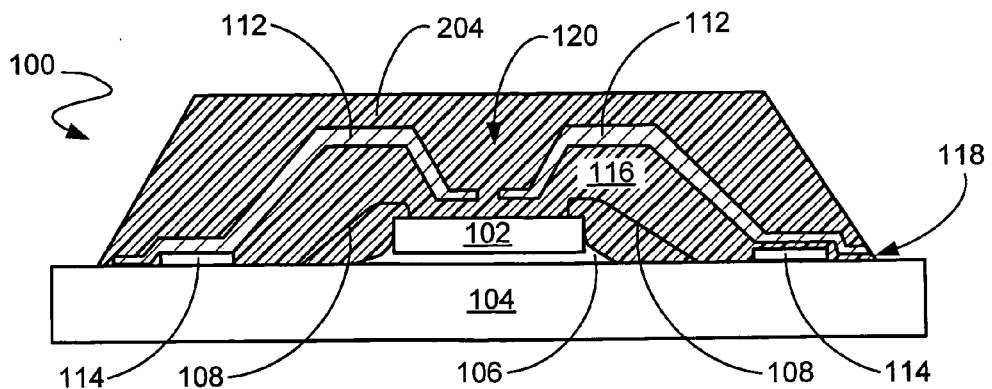
FIG. 3 shows the structure of FIG. 2 after encapsulation.

Referring now to FIG. 3, therein is shown the structure of FIG. 2 after further processing. The encapsulant 204 has hardened, thus encapsulating the substrate 104, the die 102, the epoxy 106, the conductive wires 108, the heat spreader 112, the adhesive 114, the heat spreader cavity 116, the heat spreader air vent 118, and the encapsulant guide 120. The encapsulant 204 has filled the heat spreader cavity 116, forcing air out through the heat spreader air vent 118.

Referring now to FIG. 4, therein is shown a top view of the air pocket resistant semiconductor package 100 in an intermediate stage of manufacture. The heat spreader 112 is attached to the substrate 104. The encapsulant guide 120 is located at the center of the heat spreader 112. One corner of the heat spreader 112 is aligned with a pin one guide 402. A number of heat spreader air vents 118 are positioned at the base of the heat spreader 112 at all corners. The heat spreader air vent 118 at the corner aligned with the pin one guide 402 is smaller and off center, allowing room for the injection port 206 (FIG. 2). Mold air vents 205 (FIG. 2) are located at all corners except the corner aligned with the pin one guide 402.

During the encapsulation process, the injection port 206 (FIG. 2) aligns with the pin one guide 402. The encapsulant 204 (FIG. 2) is injected through the injection port 206 and into the mold 202 (FIG. 2).

Figure 5:
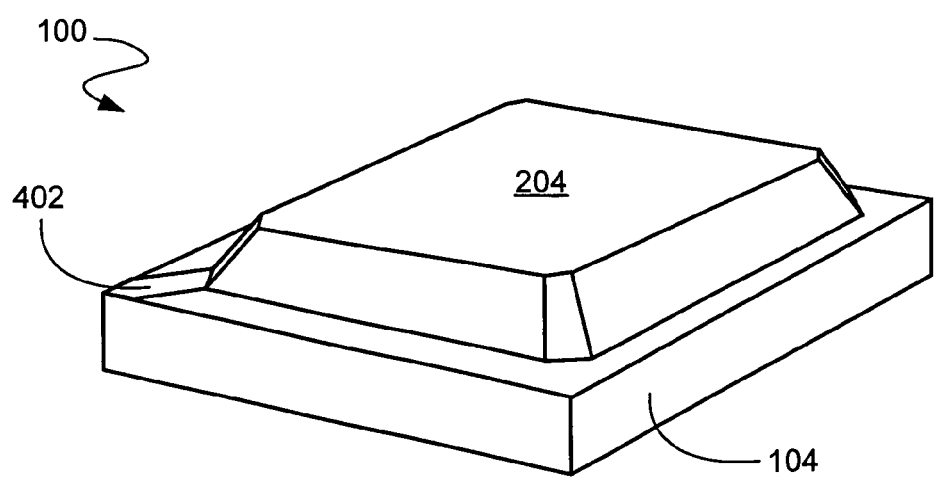
FIG. 5 is a perspective view of the structure of FIG. 4 after encapsulation.

Referring now to FIG. 5, therein is shown the structure of FIG. 4, after further processing. The encapsulant 204 has hardened, thus encapsulating the heat spreader 112 (FIG. 4), the heat spreader air vents 118 (FIG. 4), and the encapsulant guide 120 (FIG. 4). The pin one guide 402 is visible on the substrate 104.

Figure 6:
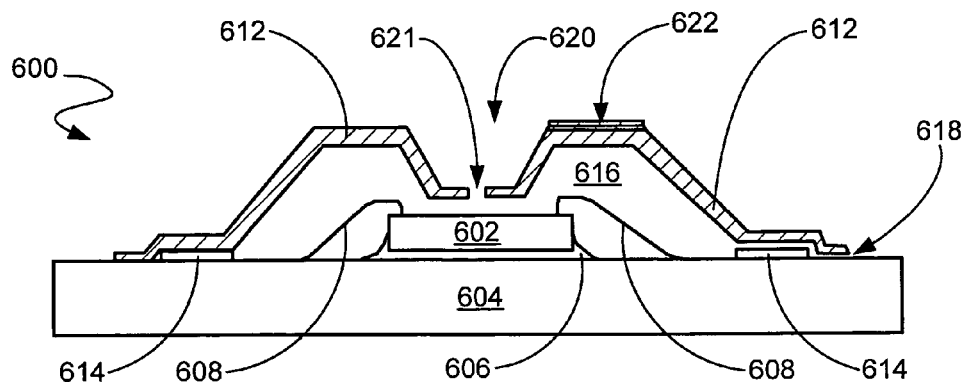
FIG. 6 is a cross-sectional view, taken along line 6—6 in FIG. 9, of an alternate embodiment of an air pocket resistant semiconductor package in an intermediate stage of manufacture, in accordance with the present invention.
Figure 9:
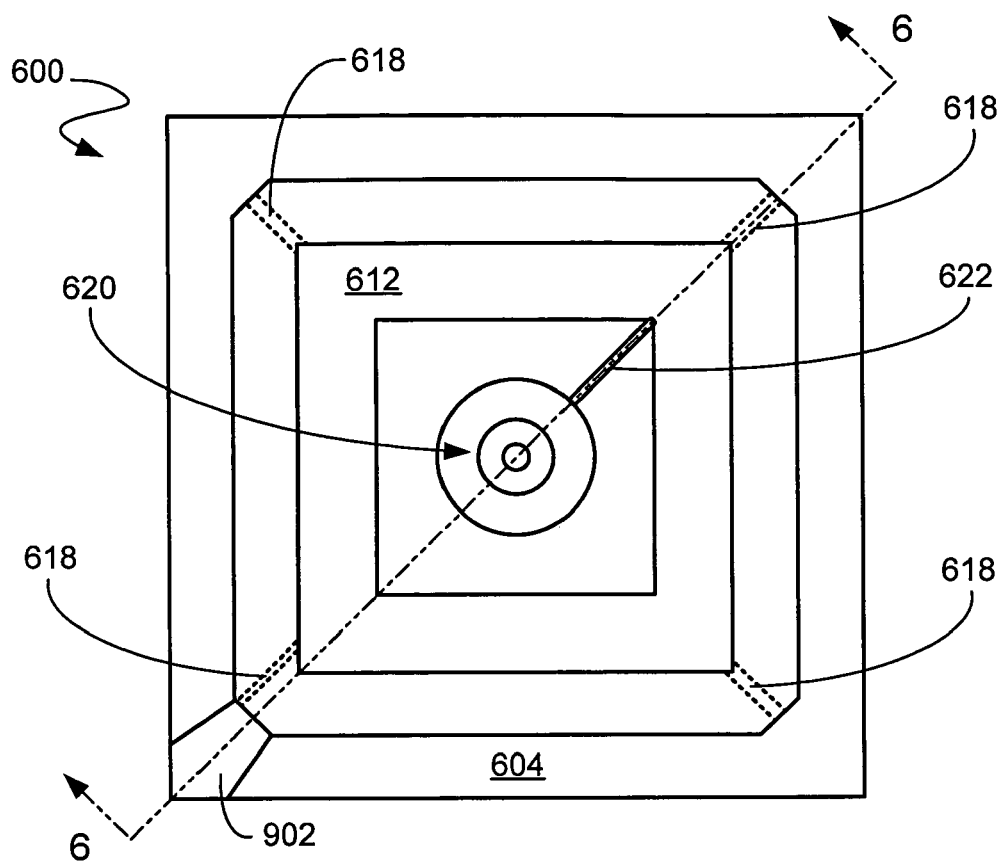
FIG. 9 is a top view of the air pocket resistant semiconductor package of FIG. 6 in an intermediate stage of manufacture.

Referring now to FIGS. 6 and 9, therein is shown a cross-sectional view, taken along line 6—6 in FIG. 9, of an alternate embodiment of an air pocket resistant semiconductor package 600 in an intermediate stage of manufacture, in accordance with the present invention. A die 602 is attached to a substrate 604 with an epoxy 606. The die 602 is then electrically connected to the substrate 604 by a number of fine conductive wires 608. The wires 608 are wire bonded to the die 602 around the periphery of the die 602.

A heat spreader 612 having corners is then attached to the substrate 604 with an adhesive 614. The heat spreader 612 encloses and covers, but is free of contact with, the die 602, the epoxy 606, and the conductive wires 608. Thus, the heat spreader 612 is formed to have a heat spreader cavity 616. In addition, the heat spreader 612 has a heat spreader air vent 618, a first encapsulant guide 620, and a second encapsulant guide 622.

A first encapsulant guide 620 is formed to be a depression in the top of the heat spreader 612. The first encapsulant guide 620 is in the shape of a funnel with sloped sides. At the bottom of the funnel is an opening 621 through the heat spreader 612. However, the second encapsulant guide 622 does not have an opening through the heat spreader 612. Instead, the second encapsulant guide 622 is positioned on the external surface of the heat spreader 612 and connects a top edge of the heat spreader 612 to the first encapsulant guide 620, located at the center of the heat spreader 612 extending therethrough. The heat spreader air vent 618 is a groove through the base of the heat spreader 612. Thus, the only breaches in the heat spreader 612 are the opening 621 and the heat spreader air vent 618.

Figure 7:
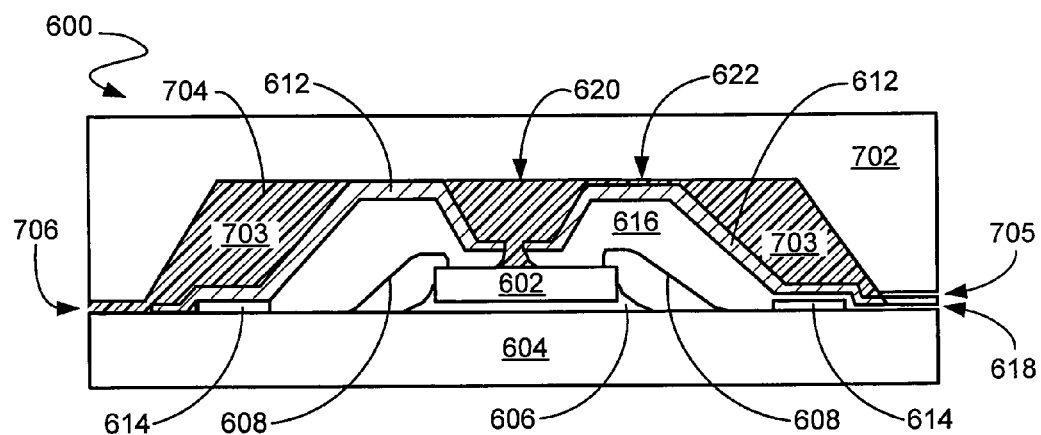
FIG. 7 illustrates the structure of FIG. 6 undergoing encapsulation.

Referring now to FIG. 7, therein is shown the structure of FIG. 6 after further processing. A mold 702 covers the substrate 604 and encloses the die 602, the epoxy 606, the conductive wires 608, the heat spreader 612, the adhesive 614, the heat spreader cavity 616, the heat spreader air vent 618, the first encapsulant guide 620, and the second encapsulant guide 622. The mold 702 contacts the top surface of the heat spreader 612, creating a mold cavity 703 around the heat spreader 112. The mold 702 has a mold air vent 705 located at the base of the mold 702 above the heat spreader air vent 618.

It has been discovered that the heat spreader air vent 618 and the encapsulant guide 620 reduce the amount of air trapped in the heat spreader cavity 616 during encapsulation. An encapsulant 704 is injected through an injection port 706. The contact between the mold 702 and the top surface of the heat spreader 612 blocks the encapsulant 704 from the top surface of the heat spreader 612. Thus, the encapsulant 704 flows around the outside of the heat spreader 612, fills the mold cavity 703, and forces air from the mold cavity 703 out through the mold air vent 705. After completely filling the mold cavity 703, the encapsulant 704 flows through the second encapsulant guide 622, located opposite the injection port 706 and on the top surface of the heat spreader 612. The encapsulant 704 then flows into the first encapsulant guide 620. The encapsulant 704 flows through the first encapsulant guide 620, filling the heat spreader cavity 616. As the encapsulant 704 fills the heat spreader cavity 616, air is forced from the heat spreader cavity 616, through the heat spreader air vent 618, and out through the mold 702.

Figure 8:
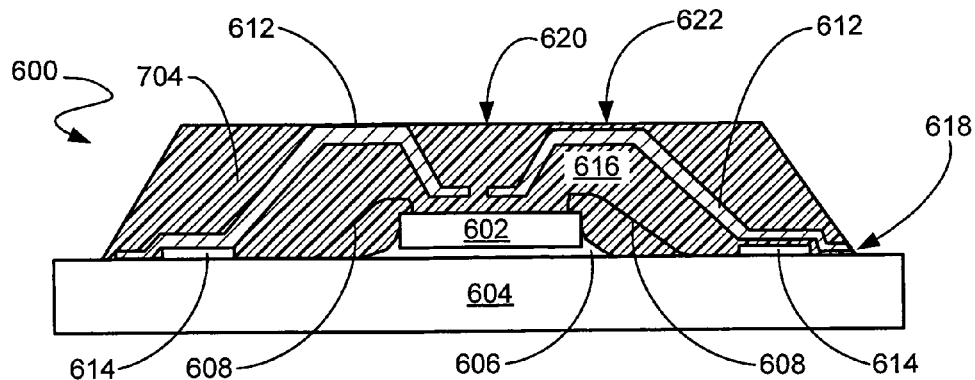
FIG. 8 shows the structure of FIG. 7 after encapsulation.

Referring now to FIG. 8, therein is shown the structure of FIG. 7 after further processing. The encapsulant 704 has hardened, thus encapsulating the substrate 604, the die 602, the epoxy 606, the conductive wires 608, the heat spreader 612, the adhesive 614, the heat spreader cavity 616, the heat spreader air vent 618, the first encapsulant guide 620, and the second encapsulant guide 622. The encapsulant 704 has filled the heat spreader cavity 616, forcing air out through the heat spreader air vent 618.

Referring now to FIG. 9, therein is shown a top view of the air pocket resistant semiconductor package 600 in an intermediate stage of manufacture. The heat spreader 612 is attached to the substrate 604. One corner of the heat spreader 612 is aligned with a pin one guide 902. The second encapsulant guide 622 is positioned on the external surface of the heat spreader 612. The second encapsulant guide 622 connects a top edge of the heat spreader 612, at a corner opposite the pin one guide 902, to the first encapsulant guide 620, located at the center of the heat spreader 612 extending therethrough. A number of air vents 618 are positioned at the base of the heat spreader 612 at all corners. The heat spreader air vent 618 at the corner aligned with the pin one guide 902 is smaller and off center, allowing room for the injection port 706 (FIG. 2). Mold air vents 705 (FIG. 2) are located at all corners except the corner aligned with the pin one guide 902.

During the encapsulation process, the injection port 706 (FIG. 7) aligns with the pin one guide 902. The encapsulant 704 (FIG. 7) is injected through the injection port 706 and into the mold 702 (FIG. 7).

Figure 10:
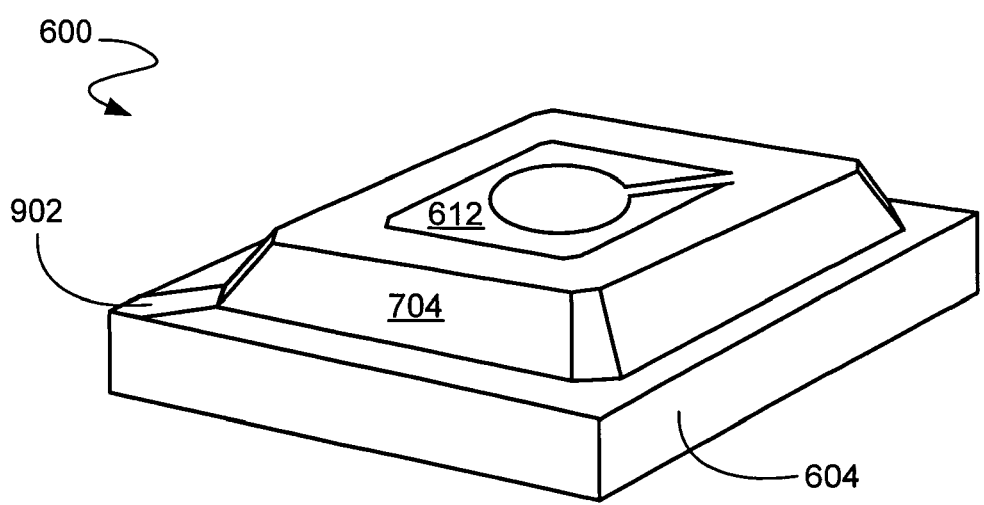
FIG. 10 is a perspective view of the structure of FIG. 9 after encapsulation.

Referring now to FIG. 10, therein is shown the structure of FIG. 9, after further processing. The encapsulant 704 has hardened, and with the exception of the top surface of the heat spreader 612, the encapsulant 704 encapsulates the heat spreader 612, the heat spreader air vents 618 (FIG. 9), the first encapsulant guide 620 (FIG. 9), and the second encapsulant guide 622 (FIG. 9). The pin one guide 902 is visible on the substrate 604. The top surface of the heat spreader 612 is exposed (not encapsulated) due to the blocking contact with the mold 702 (see FIG. 7) during the encapsulation process. Exposing the top surface of the heat spreader 612 in this manner advantageously facilitates heat dissipation from the package 600.

Figure 11:
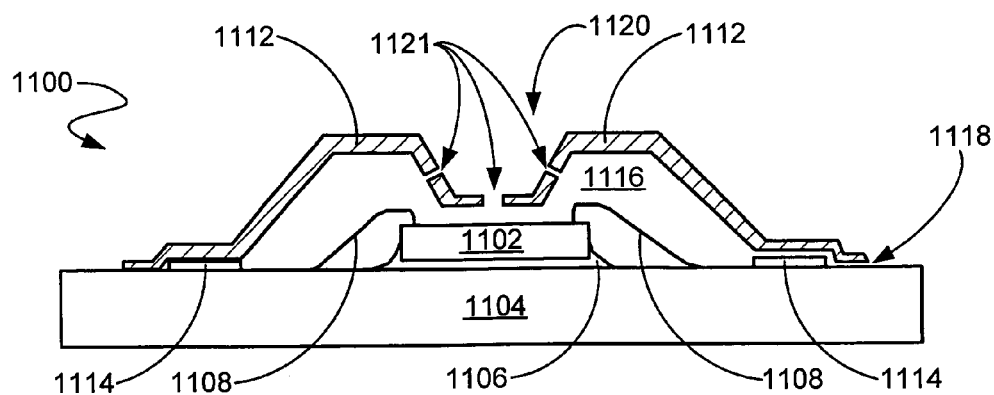
FIG. 11 is a cross-sectional view, taken along line 11—11 in FIG. 14, of an another embodiment of an air pocket resistant semiconductor package in an intermediate stage of manufacture, in accordance with the present invention.
Figure 14:
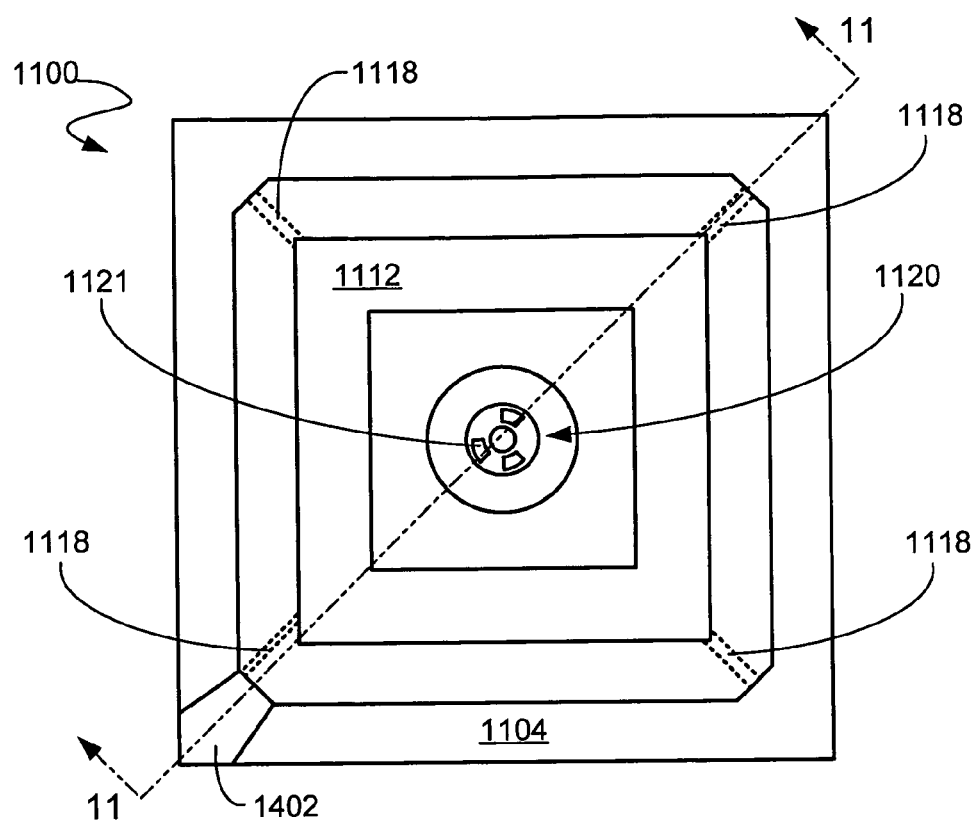
FIG. 14 is a top view of the air pocket resistant semiconductor package of FIG. 11 in an intermediate stage of manufacture.

Referring now to FIGS. 11 and 14, therein is shown a cross-sectional view, taken along line 11—11 in FIG. 14, of another embodiment of an air pocket resistant semiconductor package 1100 in an intermediate stage of manufacture, in accordance with the present invention. A die 1102 is attached to a substrate 1104 with an epoxy 1106. The die 1102 is then electrically connected to the substrate 1104 by a number of fine, conductive wires 1108. The wires 1108 are wire bonded to the die 1102 around the periphery of the die 1102.

A heat spreader 1112 having corners is then attached to the substrate 1104 with an adhesive 1114. The heat spreader 1112 encloses and covers, but is free of contact with, the die 1102, the epoxy 1106, and the conductive wires 1108. Thus, the heat spreader 1112 is formed to have a heat spreader cavity 1116.

An encapsulant guide 1120 is formed to be a depression in the top of the heat spreader 1112. The encapsulant guide 1120 is in the shape of a funnel with sloped sides. At the bottom of the funnel are openings 1121 through the heat spreader 112. A heat spreader air vent 1118 is a groove through the base of the heat spreader 1112. Thus, the only breaches in the heat spreader 1112 are the openings 1121 and the heat spreader air vent 1118.

Figure 12:
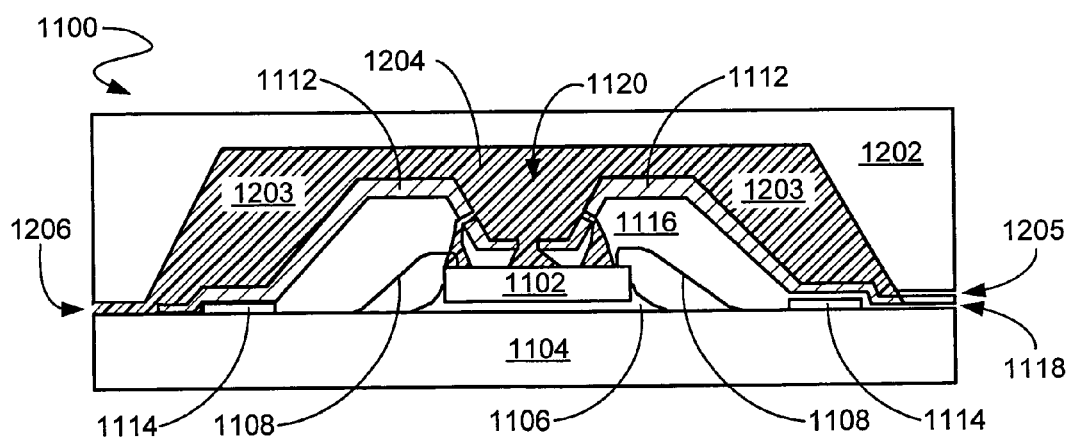
FIG. 12 illustrates the structure of FIG. 11 undergoing encapsulation.

Referring now to FIG. 12, therein is shown the structure of FIG. 11 after further processing. A mold 1202 covers the substrate 1104 and encloses the die 1102, the epoxy 1106, the conductive wires 1108, the heat spreader 1112, the adhesive 1114, the heat spreader cavity 1116, the heat spreader air vent 1118, and the encapsulant guide 1120. The mold 1202 creates a mold cavity 1203 between the mold 1202 and the surface of the heat spreader 1112. The mold 1202 has a mold air vent 1205 located at the base of the mold 1202 above the heat spreader air vent 1118.

It has been discovered that the heat spreader air vent 1118 and the encapsulant guide 1120 reduce the amount of air trapped in the heat spreader cavity 1116 during encapsulation. An encapsulant 1204 is injected through an injection port 1206. The encapsulant 1204 flows over the outside of the heat spreader 1112, fills the mold cavity 1203, and forces air from the mold cavity 1203 out through the mold air vent 1205. After completely filling the mold cavity 203, the encapsulant 1204 flows through the encapsulant guide 1120 at the center of the heat spreader 1112, filling the heat spreader cavity 1116. As the encapsulant 1204 fills the heat spreader cavity 1116, air is forced from the heat spreader cavity 1116, through the heat spreader air vent 1118, and out through the mold 1202.

Figure 13:
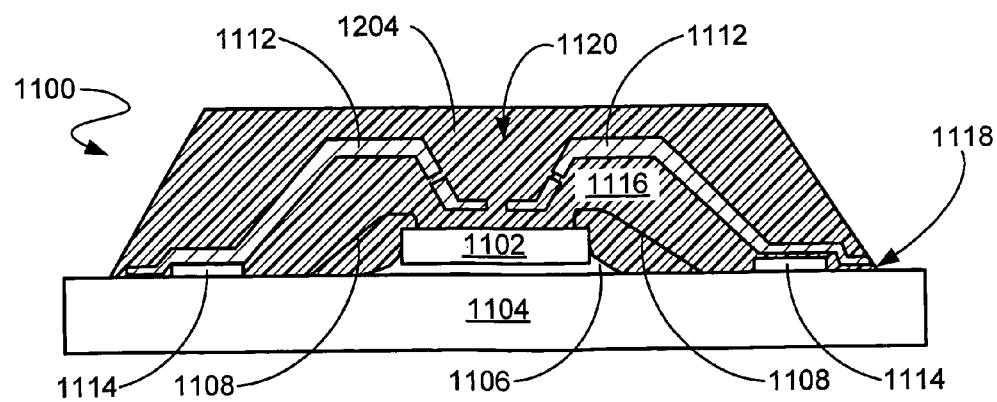
FIG. 13 shows the structure of FIG. 12 after encapsulation.

Referring now to FIG. 13, therein is shown the structure of FIG. 12 after further processing. The encapsulant 1204 has hardened, thus encapsulating the substrate 1104, the die 1102, the epoxy 1106, the conductive wires 1108, the heat spreader 1112, the adhesive 1114, the heat spreader cavity 1116, the heat spreader air vent 1118, and the encapsulant guide 1120. The encapsulant 1204 has filled the heat spreader cavity 1116, forcing air out through the heat spreader air vent 1118.

Referring now to FIG. 14, therein is shown a top view of the air pocket resistant semiconductor package 1100 in an intermediate stage of manufacture. The heat spreader 1112 is attached to the substrate 1104. The encapsulant guide 1120 is located at the center of the heat spreader 1112. One corner of the heat spreader 1112 is aligned with a pin one guide 1402. A number of heat spreader air vents 1118 are positioned at the base of the heat spreader 1112, at all corners except the corner aligned with the pin one guide 1402.

During the encapsulation process, the injection port 1206 (FIG. 12) aligns with the pin one guide 1402. The encapsulant 1204 (FIG. 12) is injected through the injection port 1206 and into the mold 1202 (FIG. 12).

Figure 15:
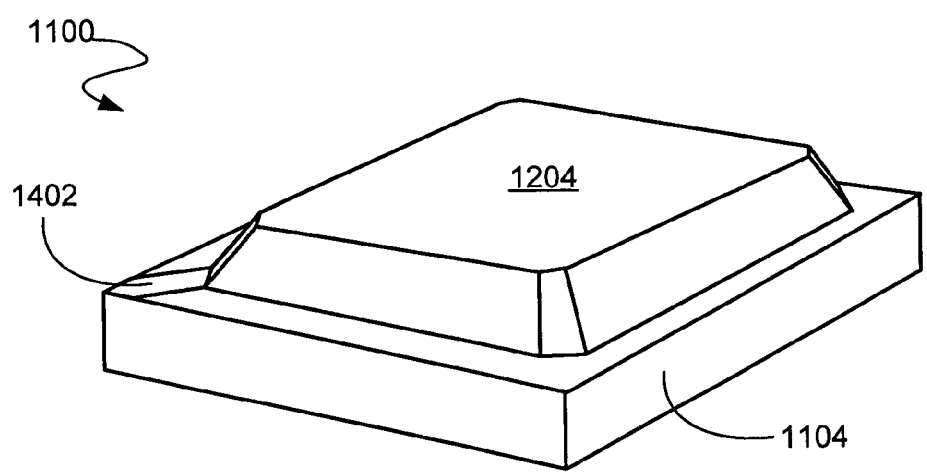
FIG. 15 is a perspective view of the structure of FIG. 14 after encapsulation.

Referring now to FIG. 15, therein is shown the structure of FIG. 14, after further processing. The encapsulant 1204 has hardened, thus encapsulating the heat spreader 1112 (FIG. 14), the heat spreader air vents 1118 (FIG. 14), and the encapsulant guide 1120 (FIG. 14). The pin one guide 1402 is visible on the substrate 1104.

Figure 16:
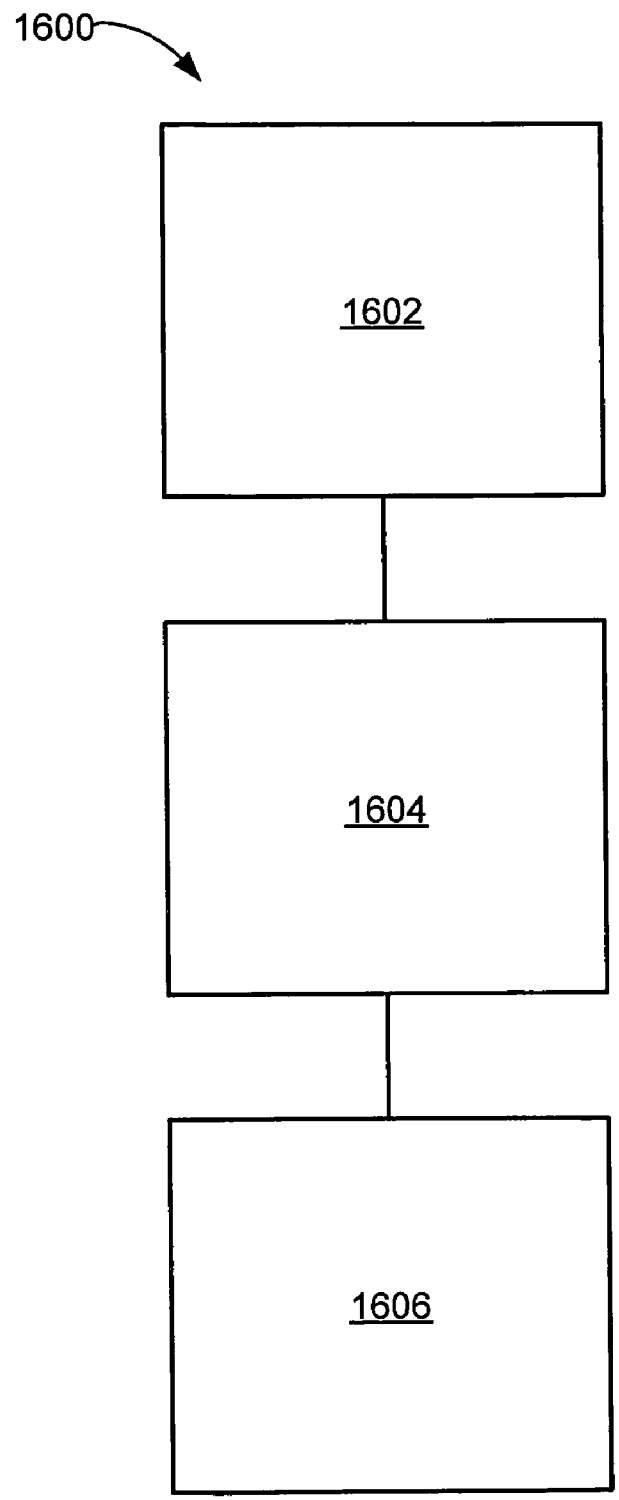
FIG. 16 is a flow chart of a method for manufacturing an air pocket resistant semiconductor package in accordance with an embodiment of the present invention.

Referring now to FIG. 16, therein is shown a flow chart of a method 1600 for manufacturing an air pocket resistant semiconductor package in accordance with an embodiment of the present invention. The method 1600 includes providing a die attached to a substrate in a block 1602; enclosing the die in a heat spreader, the heat spreader having a first encapsulant guide and an air vent in the heat spreader extending therethrough, in a block 1604; and encapsulating the die, the substrate, at least a portion of the heat spreader, the first encapsulant guide, and the air vent in an encapsulant such that the encapsulant enters the heat spreader through the first encapsulant guide and air exits the heat spreader through the air vent, thus preventing the formation of air pockets under the heat spreader in a block 1606.

Thus, it has been discovered that the air pocket resistant semiconductor package manufacturing method and apparatus of the present invention furnish important and heretofore unknown and unavailable solutions, capabilities, and functional advantages for preventing air pocket formation in semiconductor packages. The resulting process and configurations are straightforward, economical, uncomplicated, highly versatile, and effective, and can be implemented by adapting known components for ready manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. An air pocket resistant semiconductor package, comprising:
    a substrate;
    a die attached to the substrate;
    a heat spreader enclosing the die, the heat spreader further comprising:
        a first encapsulant guide, wherein the first encapsulant guide is located at the center of the heat spreader extending therethrough;
        a second encapsulant guide positioned on the external surface of the heat spreader, the second encapsulant guide connecting an edge of the heat spreader to the first encapsulant guide; and
        a heat spreader air vent incorporated in the heat spreader, extending therethrough, and configured for preventing the formation of air pockets under the heat spreader during encapsulation of the die, the substrate, and the heat spreader with an encapsulant such that the encapsulant enters the heat spreader through the first encapsulant guide and air exits the heat spreader through the heat spreader air vent.

2. The semiconductor package of claim 1 wherein;
    the substrate further comprises a pin one guide; and
    the heat spreader enclosing the die comprises the heat spreader air vent positioned at the base of the heat spreader.

3. The semiconductor package of claim 1 wherein the first encapsulant guide is configured to be a depression in the top of the heat spreader with at least an opening through the heat spreader in the depression.

4. An air pocket resistant semiconductor package, comprising:
    a substrate;
    a die;
    an epoxy attaching the die to the substrate, the substrate with a pin one guide;
    a plurality of conductive wires electrically connecting the die to the substrate;
    a heat spreader enclosing the die and the plurality of conductive wires;
    a first encapsulant guide located at the center of the heat spreader;
    a second encapsulant guide positioned on the external surface of the heat spreader, the second encapsulant guide connecting a top edge of the heat spreader at a corner opposite to the pin one guide to the first encapsulant guide located at the center of the heat spreader;

a plurality of corners having one corner of the heat spreader aligned with the pin one guide; a plurality of heat spreader air vents incorporated in the heat spreader extending therethrough the heat spreader air vents positioned at the base of the heat spreader at all corners; and the first encapsulant guide and the heat spreader air vents being configured for preventing the formation of air pockets under the heat spreader during encapsulation of the die, the substrate, the conductive wires, and the heat spreader with an encapsulant such that the encapsulant enters the heat spreader through the first encapsulant guide and air exits the heat spreader through the heat spreader air vents by:

contacting the surface of the heat spreader with the mold, providing the mold with an injection port, and aligning the injection port with the pin one guide.

5. The semiconductor package of claim 4 wherein the first encapsulant guide is configured to be a depression in the top of the heat spreader with at least an opening through the heat spreader in the depression.

* * * * *